US 6,706,553 B2

(12) United States Patent
Towle et al.

(10) Patent No.: US 6,706,553 B2
(45) Date of Patent: Mar. 16, 2004

(54) DISPENSING PROCESS FOR FABRICATION OF MICROELECTRONIC PACKAGES

(75) Inventors: Steven Towle, Phoenix, AZ (US); John Cuendet, Mesa, AZ (US); Kyle Johnson, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 09/817,710

(22) Filed: Mar. 26, 2001

(65) Prior Publication Data

US 2002/0137263 A1 Sep. 26, 2002

(51) Int. Cl.$^7$ .......................... H01L 21/44; H01L 21/48; H01L 21/50

(52) U.S. Cl. .................. 438/106; 438/108; 438/112; 438/121; 438/124; 438/125; 438/127; 438/25; 438/26; 438/51; 438/55; 438/64; 257/678; 257/687

(58) Field of Search ............ 438/106–112, 121–127, 438/25–26, 51, 55, 64; 257/678, 687

(56) References Cited

U.S. PATENT DOCUMENTS

| | | | |
|---|---|---|---|
| 5,048,179 A | | 9/1991 | Shindo et al. ............... 29/840 |
| 5,457,299 A | * | 10/1995 | Blais et al. ............ 219/121.85 |
| 5,497,033 A | * | 3/1996 | Fillion et al. ............... 257/723 |
| 6,025,995 A | | 2/2000 | Marcinkiewicz ........... 361/760 |
| 6,154,366 A | * | 11/2000 | Ma et al. .................... 361/704 |
| 6,232,667 B1 | * | 5/2001 | Hultmark et al. .......... 257/777 |
| 6,239,482 B1 | | 5/2001 | Fillion et al. ............... 257/678 |
| 6,271,469 B1 | * | 8/2001 | Ma et al. .................... 174/52.4 |
| 6,320,127 B1 | * | 11/2001 | Nagarajan et al. ......... 174/52.2 |
| 6,423,570 B1 | * | 7/2002 | Ma et al. .................... 438/106 |
| 2002/0070443 A1 | * | 6/2002 | Mu et al. .................... 257/712 |
| 2002/0074641 A1 | * | 6/2002 | Towle et al. ................ 257/692 |

FOREIGN PATENT DOCUMENTS

| | | |
|---|---|---|
| EP | 0604005 | 6/1994 |
| JP | 62004351 | 1/1987 |
| JP | 3155144 | 7/1991 |
| JP | 10092970 | 4/1998 |
| WO | WO-99/56316 | 11/1999 |

OTHER PUBLICATIONS

U.S. patent application Ser. No. 09/438,221, filed Nov. 12, 1999.
U.S. patent application Ser. No. 09/679,733, filed Oct. 4, 2000.
U.S. patent application Ser. No. 09/658,819, filed Sep. 8, 2000.
U.S. patent application Ser. No. 09/660,755, filed Sep. 13, 2000.
U.S. patent application Ser. No. 09/660,757, filed Sep. 13, 2000.
U.S. patent application Ser. No. 09/733,289, filed Dec. 8, 2000.
U.S. patent application Ser. No. 09/738,117, filed Dec. 15, 2000.

(List continued on next page.)

Primary Examiner—Matthew Smith
Assistant Examiner—Granvill D Lee, Jr.
(74) Attorney, Agent, or Firm—Schwegman, Lundberg, Woessner & Kluth, P.A.

(57) ABSTRACT

A microelectronic package including at least one microelectronic die disposed within an opening in a microelectronic package core, wherein a liquid encapsulation material is injected with a dispensing needle within portions of the opening not occupied by the microelectronic dice. The encapsulation material is cure thereafter. Interconnection layers of dielectric materials and conductive traces are then fabricated on the microelectronic die, the encapsulation material, and the microelectronic package core to form the microelectronic package.

30 Claims, 9 Drawing Sheets

OTHER PUBLICATIONS

U.S. patent application Ser. No. 09/692,908, filed Oct. 19, 2000.
U.S. patent applicatiion Ser. No. 09/691,738, filed Oct. 18, 2000.
U.S. patent application Ser. No. 09/640,961, filed Aug. 16, 2000.
U.S. patent application Ser. No. 09/884,595, filed Jun. 18, 2001.

* cited by examiner

DISPENSING PROCESS FOR FABRICATION OF MICROELECTRONIC PACKAGES

BACKGROUND OF THE INVENTION

1. Field of the Invention

The present invention relates to processes for the fabrication of a microelectronic package. In particular, the present invention relates to a dispensing process that encapsulates at least one microelectronic die within a microelectronic package core to form a microelectronic package.

2. State of the Art

Higher performance, lower cost, increased miniaturization of integrated circuit components, and greater packaging density of integrated circuits are ongoing goals of the computer industry. As these goals are achieved, microelectronic dice become smaller. Of course, the goal of greater packaging density requires that the entire microelectronic die package be equal to or only slightly larger (about 10% to 30%) than the size of the microelectronic die itself. Such microelectronic die packaging is called a "chip scale packaging" or "CSP".

As shown in FIG. 22, true CSP involves fabricating build-up layers directly on an active surface 204 of a microelectronic die 202. The build-up layers may include a dielectric layer 206 disposed on the microelectronic die active surface 204. Conductive traces 208 may be formed on the dielectric layer 206, wherein a portion of each conductive trace 208 contacts at least one contact 212 on the active surface 204. External contacts, such as solder balls or conductive pins for contact with an external component (not shown), may be fabricated to electrically contact at least one conductive trace 208. FIG. 22 illustrates the external contacts as solder balls 214, which are surrounded by a solder mask material 216 on the dielectric layer 206. However, in such true CSP, the surface area provided by the microelectronic die active surface 204 generally does not provide enough surface for all of the external contacts needed to contact the external component (not shown) for certain types of microelectronic dice (e.g., logic).

Additional surface area can be provided through the use of an interposer, such as a substrate (substantially rigid material) or a flex component (substantially flexible material). FIG. 23 illustrates a substrate interposer 222 having a microelectronic die 224 attached to and in electrical contact with a first surface 226 of the substrate interposer 222 through small solder balls 228. The small solder balls 228 extend between contacts 232 on the microelectronic die 224 and conductive traces 234 on the substrate interposer first surface 226. The conductive traces 234 are in discrete electrical contact with bond pads 236 on a second surface 238 of the substrate interposer 222 through vias 242 that extend through the substrate interposer 222. External contacts 244 (shown as solder balls) are formed on the bond pads 236. The external contacts 244 are utilized to achieve electrical communication between the microelectronic die 224 and an external electrical system (not shown).

The use of the substrate interposer 222 requires a number of processing steps. These processing steps increase the cost of the package. Additionally, even the use of the small solder balls 228 presents crowding problems which can result in shorting between the small solder balls 228 and can present difficulties in inserting underfill material between the microelectronic die 224 and the substrate interposer 222 to prevent contamination and provide mechanical stability. Furthermore, current packages may not meet power delivery requirements for future microelectronic dice 224 due to thickness of the substrate interposer 222, which causes land-side capacitors to have too high an inductance.

FIG. 24 illustrates a flex component interposer 252 wherein an active surface 254 of a microelectronic die 256 is attached to a first surface 258 of the flex component interposer 252 with a layer of adhesive 262. The microelectronic die 256 is encapsulated in an encapsulation material 264. Openings are formed in the flex component interposer 252 by laser ablation through the flex component interposer 252 to contacts 266 on the microelectronic die active surface 254 and to selected metal pads 268 residing within the flex component interposer 252. A conductive material layer is formed over a second surface 272 of the flex component interposer 252 and in the openings. The conductive material layer is patterned with standard photomask/etch processes to form conductive vias 274 and conductive traces 276. External contacts are formed on the conductive traces 276 (shown as solder balls 248 surrounded by a solder mask material 282 proximate the conductive traces 276).

The use of a flex component interposer 252 requires gluing material layers which form the flex component interposer 252 and requires gluing the flex component interposer 252 to the microelectronic die 256. These gluing processes are relatively difficult and increase the cost of the package. Furthermore, the resulting packages have been found to have poor reliability.

Therefore, it would be advantageous to develop new apparatus and techniques to provide additional surface area to form traces for use in CSP applications, which overcomes the above-discussed problems.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
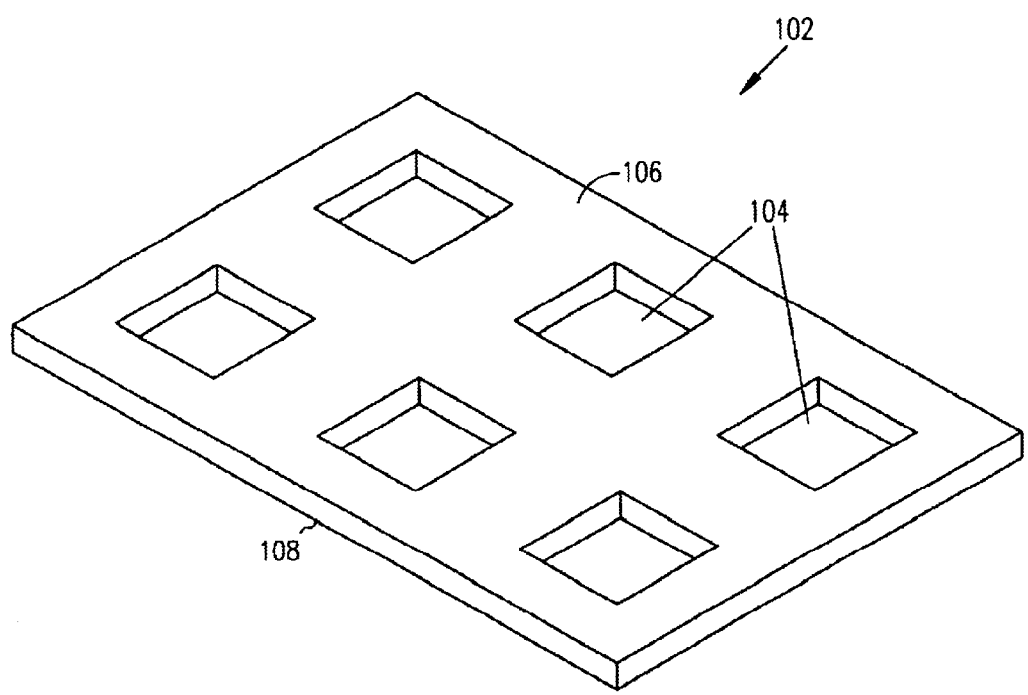
FIG. 1 is an oblique view of a microelectronic package core, according to the present invention.

In the following detailed description, reference is made to the accompanying drawings that show, by way of illustration, specific embodiments in which the invention may be practiced. These embodiments are described in sufficient detail to enable those skilled in the art to practice the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention includes a microelectronic die fabrication technology that places at least one microelectronic die within at least one opening in a microelectronic package core or other microelectronic package substrate and secures the microelectronic die/dice within the opening(s) with a liquid encapsulation material that is dispensed with a needle. The liquid encapsulation material is cured thereafter. Interconnection layers of dielectric materials and conductive traces are then fabricated on the microelectronic die/dice, the encapsulation material, and the microelectronic package core to form a microelectronic die.

FIG. 1 illustrates a microelectronic package core 102 used to fabricate a microelectronic package. The microelectronic package core 102 preferably comprises a substantially planar material. The material used to fabricate the microelectronic package core 102 may include, but is not limited to, a Bismaleimide Triazine ("BT") resin based laminate material, an FR4 laminate material (a flame retarding glass/epoxy material), various polyimide laminate materials, other polymers and polymer composite materials, ceramic material, and the like, and metallic materials (such as copper) and the like.

Figure 2A:
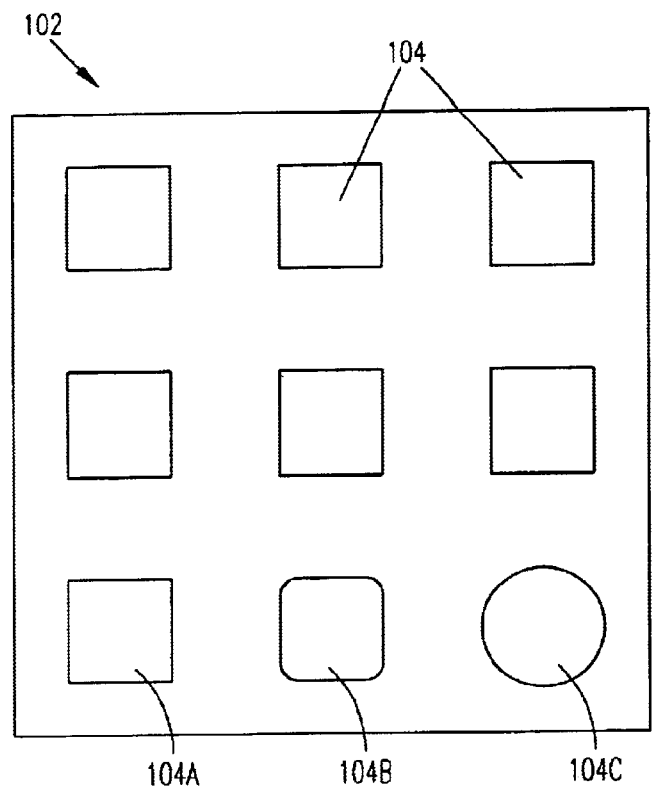
FIG. 2 is a top plan view of a microelectronic package core having examples of alternate microelectronic package core openings, according to the present invention.
Figure 2B:
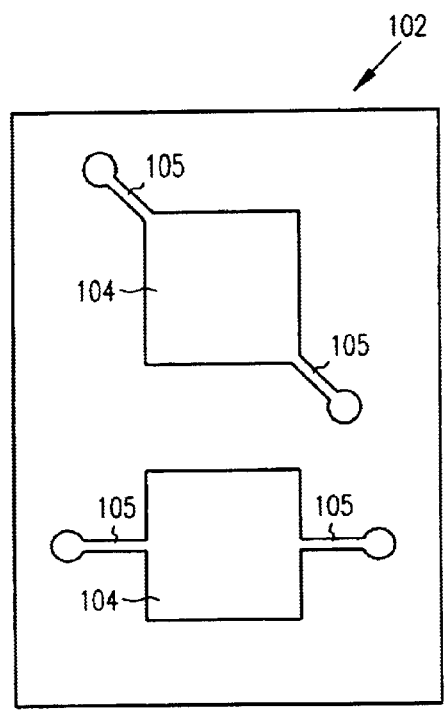

The microelectronic package core 102 has at least one opening 104 extending therethrough from a first surface 106 of the microelectronic package core 102 to an opposing second surface 108 of the microelectronic package core 102. As shown in FIG. 2a, the opening(s) 104 may be of any shape and size including, but not limited to, rectangular/square 104a, rectangular/square with rounded corners 104b, and circular 104c. In an alternate embodiment shown in FIG. 2b, the opening(s) 104 may have channels 105 extending from the opening(s) 104 to allow remote placement of the needles in a vacuum assisted dispense process (as will be subsequently discussed). In a preferred embodiment, the channels 105 extend through the thickness of the microelectronic package core 102 in a similar fashion as the opening(s) 104. Such an arrangement can be advantageous in obtaining optimal flow of the liquid dispense material through the opening(s) 104, and also, if any defects are associated with the needle position, the defects will be located at a position where they will be less detrimental to the final microelectronic package. The only limitation on the size and shape of the opening(s) 104 is that they must be appropriately sized and shaped to house a corresponding microelectronic die or dice therein, as will be discussed below.

Figure 3:
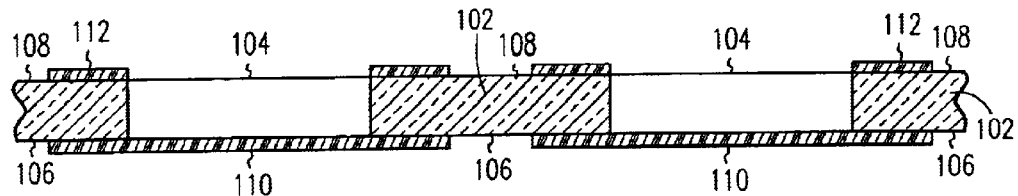
FIG. 3 is a side cross-sectional view of a microelectronic package core having a first protective film attached to a first surface thereof and spanning the microelectronic package core openings, and a backside protective film attached to a second surface thereof.

FIGS. 3–9 illustrate a compression molding method for fabricating a microelectronic device. FIG. 3 illustrates at least one first protective film 110 abutting at least portions of the microelectronic package core first surface 106, such that the first protective film 110 spans the microelectronic package core opening(s) 104. A backside protective film 112 abuts at least a portion of the microelectronic package core second surface 108 proximate the microelectronic package core opening(s) 104 (but does not span it). The first protective film 110 and the backside protective film 112 are preferably a substantially flexible material, such as Kapton® polyimide film (E. I. du Pont de Nemours and Company, Wilmington, Del.), but may be made of any appropriate material, including metallic films. In a preferred embodiment, the first protective film 110 and the backside protective film 112 would have substantially the same coefficient of thermal expansion (CTE) as the microelectronic package core 102.

Figure 4:
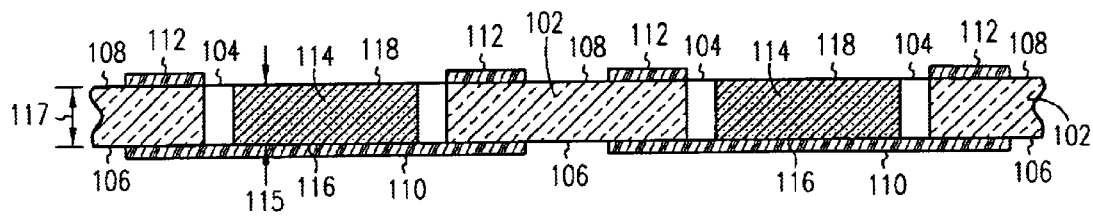
FIG. 4 is a side cross-sectional view of microelectronic dice disposed within openings of the microelectronic package core, wherein the microelectronic dice also abut the first protective film.

FIG. 4 illustrates microelectronic dice 114, each having an active surface 116 and a back surface 118, placed in corresponding openings 104 of the microelectronic package core 102. The microelectronic dice 114 may be any known active or passive microelectronic device including, but not limited to, logic (CPUs), memory (DRAM, SRAM, SDRAM, etc.), controllers (chip sets), capacitors, resistors, inductors, and the like.

Preferably, the thickness 117 of the microelectronic package core 102 and the thickness 115 of the microelectronic dice 114 are substantially equal. The microelectronic dice 114 are each placed such that their active surfaces 116 abut the first protective film 110. The first protective film 110 may have an adhesive, such as silicone or acrylic, which attaches to the microelectronic package core first surface 106 and the microelectronic die active surface 116. The backside protective film 112 may also have an adhesive that attaches to the microelectronic package core second surface 108.

Figure 5:
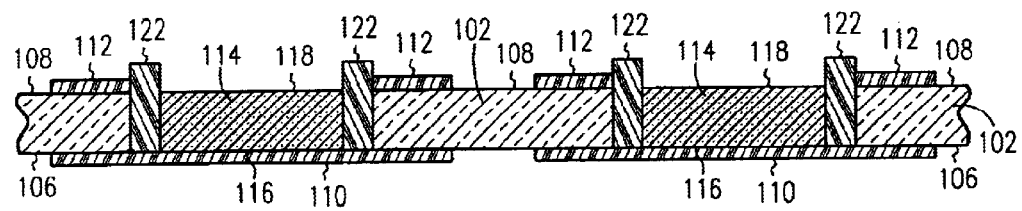
FIG. 5 is a side cross-sectional view of the assembly of FIG. 4 having a particlized encapsulation material in the microelectronic package core openings.
Figure 6:
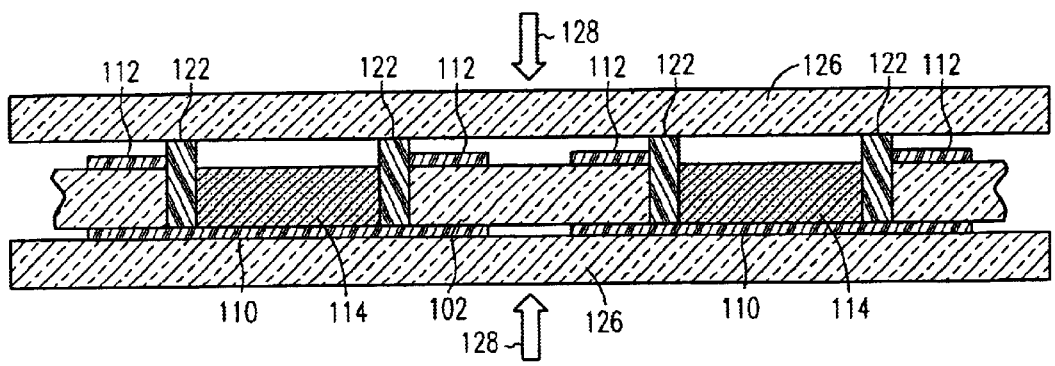
FIG. 6 is a side cross-sectional view of the assembly of FIG. 5 positioned between compression plates.

As shown in FIG. 5, a particlized encapsulation material 122, such as plastic, resin, epoxy, elastomeric (e.g., rubbery) materials, and the like, is disposed in portions of the opening(s) 104 (see FIG. 4) not occupied by the microelectronic die 114. As shown in FIG. 6, a first compression plate 124 is brought into contact with the first protective film 110, and a second compression plate 126 is brought into contact with the particlized encapsulation material 122. To facilitate release of the material from the plates 124 and/or 126, a protective film made of a chemically inert material, such as polytetrafluoroethylene (PTFE), may be disposed to abut the plate(s) 124 and/or 126. An approximate 400 pound per square inch load (shown by arrows 128) is exerted on the microelectronic package core 102, including the particlized encapsulation material 122, which results in the particlized encapsulation material 122 becoming molten and forming a solid mass of encapsulation material 132 (see FIG. 7). The encapsulation material 132 secures the microelectronic die 114 within the microelectronic package core 102, provides mechanical rigidity for the resulting structure, and provides surface area for the subsequent build-up of trace layers.

Figure 7:
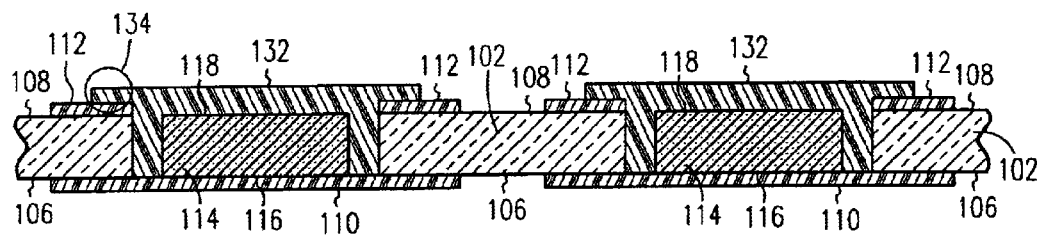
FIG. 7 is a side cross-sectional view of the assembly of FIG. 6 after compression from the compression plates.
Figure 8:
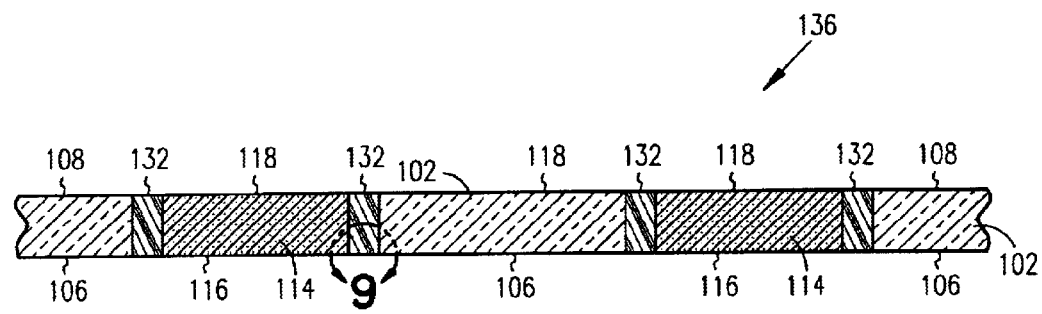
FIG. 8 is a side cross-sectional view of the assembly of FIG. 7 after encapsulation material grind back.

During the compression process, a portion of the encapsulation material 132 bleeds over the backside protective film 112 (shown in circle 134) and may cover the microelectronic dice back surfaces 118, as shown in FIG. 7 (the first compression plate 124 and the second compression plate 126 having been removed). The backside protective film 112 is used to assist in removing the overmolding. However, this overmolding requires substantial back grinding to result in a panel 136 having a planar surface of the encapsulation material 132, which is substantially even with the microelectronic dice back surface 118 and the microelectronic package core second surface 108, as shown in FIG. 8 (the first protective film 110 and the backside protective film 112 having been removed).

Figure 9:
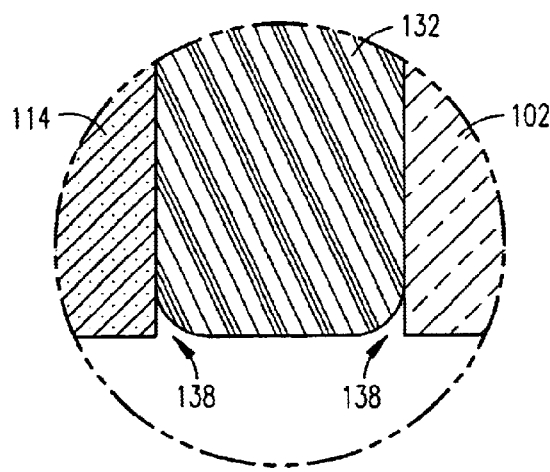
FIG. 9 is a side cross-sectional view of the insert 9 of FIG. 8 showing voids near the corners of the microelectronic die and the microelectronic package core.

Furthermore, as shown in FIG. 9 (which is a close-up view of inset 9 of FIG. 8), the compression molding process may result in voids 138 occurring proximate the corners of the microelectronic dice 114 and/or the microelectronic package core 102. These voids 138 may cause problems in subsequent processing steps. Other potential issues with compression molding include warpage of the panel 136; the microelectronic dice 114 may move on the first protective film 110 which results in problems with microelectronic die-to-die pattern alignment in build-up layers (discussed subsequently); the compression may result in cracking of the microelectronic dice 114; the compression molding process may be difficult to implement with large assemblies; and fine particlization of the encapsulation material 122 is required to achieve uniform molding which may be a health hazard on inhalation and may be incompatible with operation in a clean room.

Figure 10:
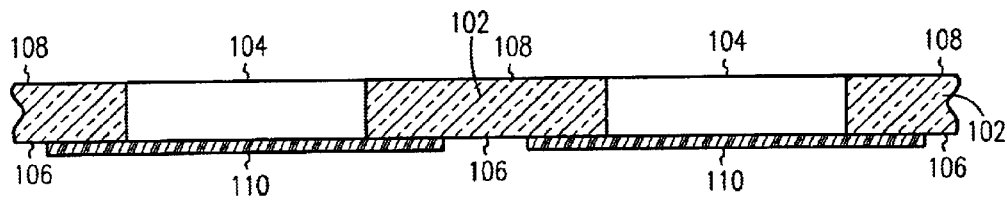
FIG. 10 is a side cross-sectional view of a microelectronic package core having a first protective film attached to a first surface thereof and spanning the package core openings, according to the present invention.
Figure 11:
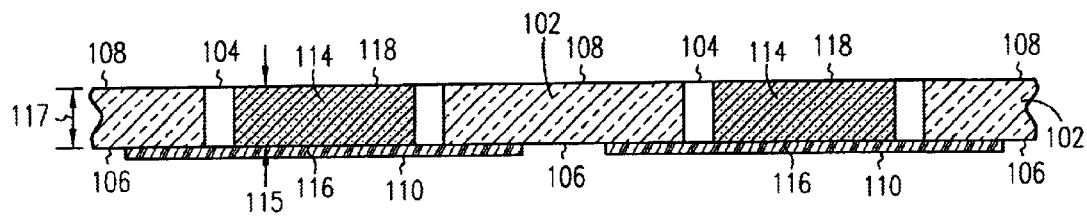
FIG. 11 is a side cross-sectional view of microelectronic dice disposed within openings of the microelectronic package core, wherein the microelectronic dice also abut the first protective film, according to the present invention.

The present invention relates to a dispensing processes, shown in FIGS. 10–18, for replacing the compression molding technique, discussed above. As shown in FIG. 10, the microelectronic package core 102 has at least one the first protective film 110 abutting at least portions of the microelectronic package core first surface 106 such that the first protective film 110 spans the microelectronic package core opening(s) 104. As shown in FIG. 11, microelectronic dice 114, each having an active surface 116 and a back surface 118, are placed in corresponding openings 104 of the microelectronic package core 102 such that the microelectronic dice active surfaces 116 abut the first protective film 110.

Figure 12:
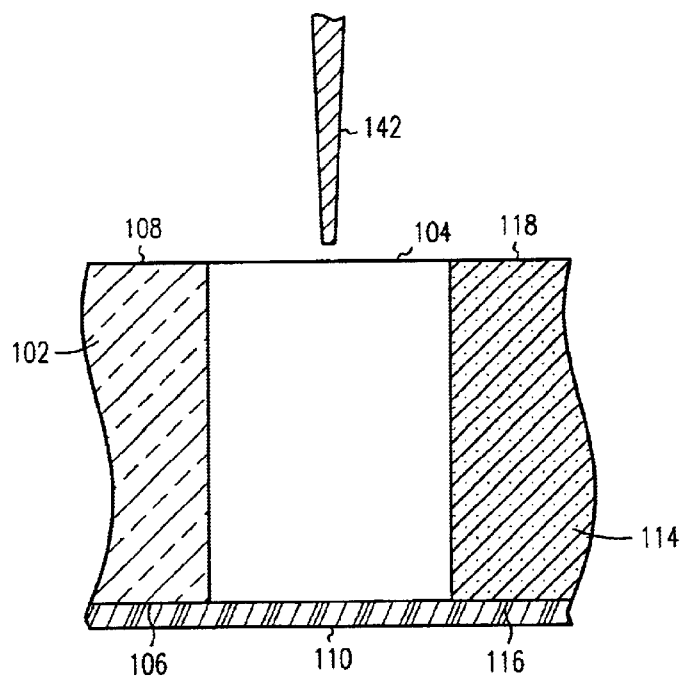
FIG. 12 is a side cross-sectional view of a dispensing needle inserted into the microelectronic package core opening, according to the present invention.
Figure 13:
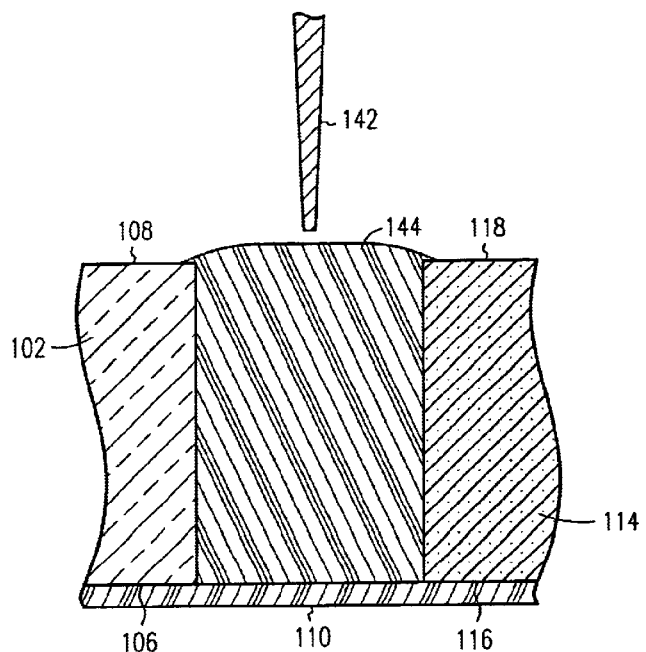
FIG. 13 is a side cross-sectional view of a dispensing needle after the filling of the microelectronic package core opening with encapsulation material, according to the present invention.

As shown in FIGS. 12 and 13, a dispensing tool, such as a dispensing needle 142, is used to inject a liquid encapsulation material 144 in portions of the opening(s) 104 (see FIG. 10) not occupied by the microelectronic die 114. The dispensing needle 142 may be of the type used to inject an underfill material between a package and a BGA flip-chip, as known in the art. The encapsulation material may include, but is not limited to, plastic, resin, epoxy, elastomeric (i.e., rubbery) materials, and the like. However, it is understood that the encapsulation material 144 should have good adhesion to the microelectronic dice 114 and to the microelectronic package core 102, should, if possible, have a coefficient of thermal expansion similar to that of the microelectronic dice 114 and to the microelectronic package core 102, should have adequate compliance and other mechanical properties such that any mismatch in the inherent properties between the microelectronic package core 102 and the microelectronic dice 114 can be accommodated, and should have adequate flow and other dispensing properties such that it is compatible of being dispensed with the dispensing needle 142. The liquid encapsulation material 144 having such properties may include, but are not limited to, Shin-Etsu 122X silica-filled epoxy (available from Shin-Etsu Chemical Co., Ltd., Japan) and Dow Corning DC6812 silicone (available from Dow Corning, Midland, Mich., USA).

Figure 14:
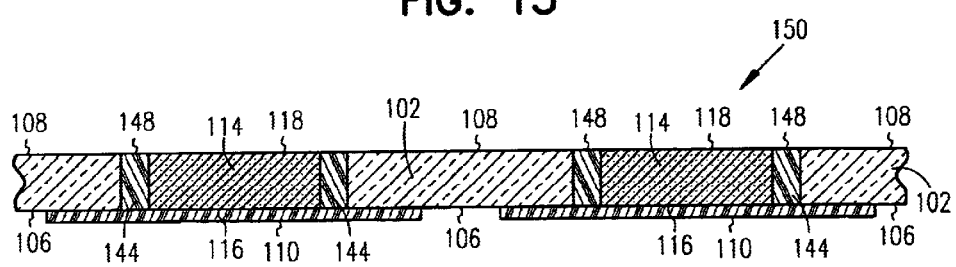
FIG. 14 is a side cross-sectional view of the assembly after encapsulation, according to the present invention.

The assembly is then cured at a temperature and for a time sufficient to bring the liquid encapsulation material 144 to a solid or substantially solid state. As shown in FIG. 14, a first surface 148 of the encapsulation material 144 is substantially planar to the microelectronic package core second surface 108. Thus, no further planarization (i.e., grinding) is require, such that interconnection layers may be formed directly on the assembly 150.

In another embodiment, the dispensing needle 142 may be inserted into the microelectronic package core opening(s) 104 between the microelectronic package core 102 and microelectronic die 114 near the first protective film 110. As the liquid encapsulation material 144 is injected, the dispensing needle 142 is withdrawn from the package core opening(s) 104. The injection of the liquid encapsulation material 144 is complete when the package core opening(s) is filled, as shown in FIG 13. It is, of course, understood that the dispensing needle 142 may be moved around within the package core opening(s) 104 while injecting the encapsulation material 144 in order to uniformly distribute the encapsulation material 144.

Figure 15:
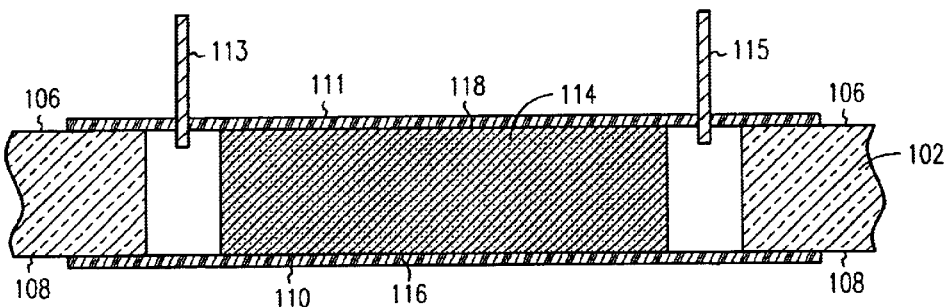
FIGS. 15 and 16 are a side cross-sectional views illustrating a vacuum assisted process of dispensing an encapsulation material, according to the present invention.
Figure 16:
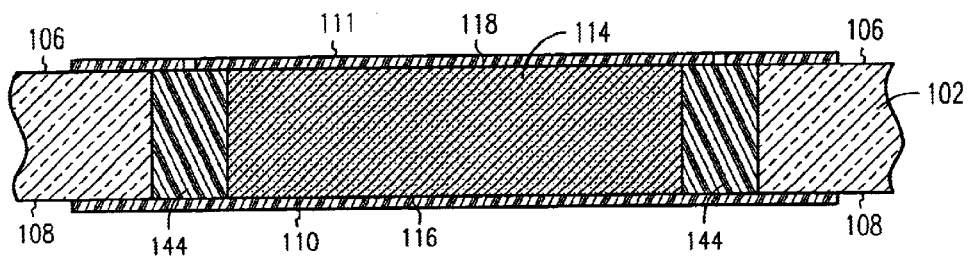

In yet another embodiment shown in FIG. 15, the microelectronic package core opening(s) 104 between the microelectronic package core 102 and the microelectronic die 114 is sealed with the first protective film 110 and a second protective film 111 that spans the microelectronic package core opening(s) 104 proximate the microelectronic dice back surfaces 118 and the microelectronic package core second surface 108. A first needle 113 and a second needle 115 are inserted into the second protective film 111. At least a partial vacuum is pulled with the first needle 113 and the encapsulation material 144 is injected with the second needle 115. The first needle 113 and second needle 115 may be inserted through preformed holes in the second protective film 111 or simply inserted through the second protective film 111. After the microelectronic package core opening is filled, as shown in FIG. 16, the first needle 113 and the second needle 115 are withdrawn. It has been found that this vacuum assisted process, results in few voids, less overmolding, allows a wider range of encapsulation material Theological properties, and allows a greater range of possible microelectronic die-to-microelectronic package core geometries.

In another embodiment, referring back to FIG. 2b, the channels 105 may be utilized in the vacuum assisted process. The first needle 113 (FIG. 14) may be inserted in one channel 105 and a second needle 115 may be inserted in an opposing channel 105. The channel arrangement shown in FIG. 2b, wherein the channels 105 extend from opposing corner, is preferred with a vacuum assisted process because it prevents the formation of zones of zero net flow. These zones may form when a single stream is split into two streams flowing in substantially opposing directions and then meet again substantially head on. Such zones of zero net flow can lead to the formation of voids. Also, if there are any defects (such as variations in topography) at the positions of the insertion of the needles 113 and 115, traces in the first layer of the package could be routed around these positions. Such alternate routing is simpler and puts fewer constraints on other package design considerations if the channels 105 extend from the corners rather than from the sides of the openings 104.

Figure 17:
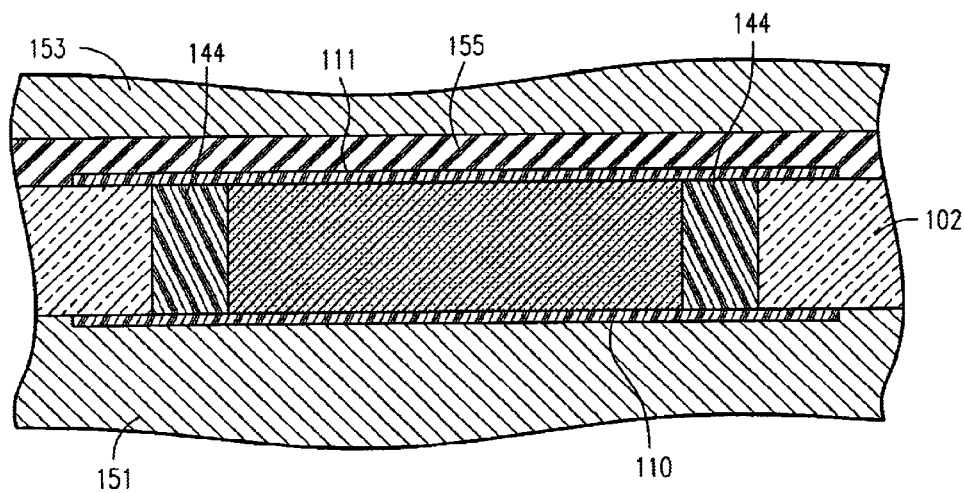
FIG. 17 is a side cross-sectional view illustrating a technique for improving the planarity of the encapsulation material, according to the present invention.

The assembly is then cured at a temperature and for a time sufficient to bring the liquid encapsulation material 144 to a solid or substantially solid state. As shown previously in FIG. 14, a first surface 148 of the encapsulation material 144 is substantially planar to the microelectronic package core second surface 108. Thus, no further planarization (i.e., grinding) is require, such that interconnection layers may be formed directly on the assembly 150. However, the planarization of the encapsulation material front surface 148 can be improved further, if necessary, by placing the assembly between two plates with the microelectronic package core first surface 106 and microelectronic die active surface 116 against a hard surfaced plate 151 (i.e., polished steel) and the microelectronic package core second surface 108 and microelectronic die back surface 116 against a soft surfaced plate 153 (e.g., having a silicon rubber surface 155) with the application of compression force, as shown in FIG. 17. Such a cure process with applied pressure confers the added advantage of potentially improving the fracture toughness of the cured encapsulation material 144. By proper optimization of the dispense process, it is also possible to prevent contamination of the backside of the die or dice by the encapsulation material.

Figure 18:
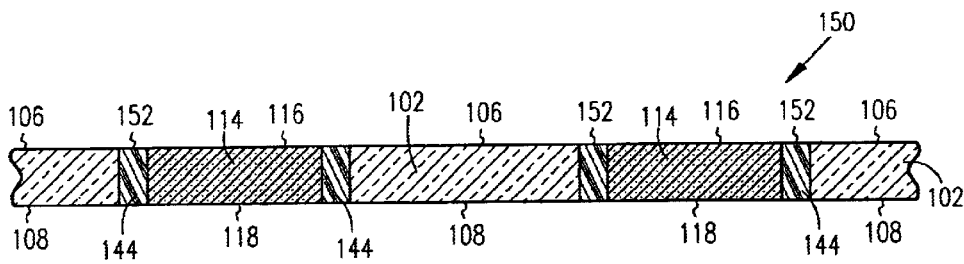
FIG. 18 is a side cross-sectional view of either assembly of FIG. 14 or FIG. 17 having been flipped over and the first protective film and the second protective film (if present) removed, according to the present invention.

After the curing of the encapsulation material 144, the assembly 150 is flipped over and the first protective film 110 and the second protective film 111 (if present) is removed, as shown in FIG. 18, to expose the microelectronic die active surface 116 and the microelectronic die back surface 118. As also shown in FIG. 18, the encapsulation material 144 forms at least one second surface 152 that is substantially planar to the microelectronic die active surface 116 and the microelectronic package core first surface 106. The encapsulation material second surface 152 may be utilized in further fabrication steps, along with the microelectronic package core first surface 106, as additional surface area for the formation of interconnection layers, such as dielectric material layers and conductive traces.

Although the following description relates to a bumpless, built-up layer technique for the formation of interconnection layers, the method of fabrication is not so limited. The interconnection layers may be fabricated by a variety of techniques known in the art.

Figure 19:
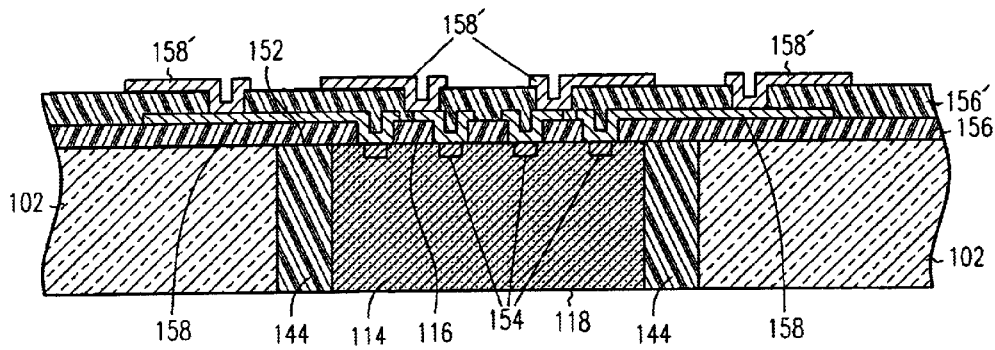
FIG. 19 is a side cross-sectional view of a microelectronic die having interconnection layers formed on an active surface thereof, according to the present invention.

FIG. 19 illustrates a view of a single microelectronic die 114 within the microelectronic package core 102 and the encapsulation material 144 disposed between the microelectronic die 114 and the microelectronic package core 102. The microelectronic die 114, of course, includes a plurality of electrical contacts 154 located on the microelectronic die active surface 116. The electrical contacts 154 are electrically connected to circuitry (not shown) within the microelectronic die 114. Only four electrical contacts 154 are shown for sake of simplicity and clarity.

As shown in FIG. 19, dielectric layers 156, 156', and conductive traces 158, 158' are layered, respectively, over the microelectronic die active surface 116 (including the electrical contacts 154), the microelectronic package core first surface 106, and the encapsulation material second surface 152. The dielectric layers 156, 156' are preferably epoxy resin, polyimide, bisbenzocyclobutene, and the like, and more preferably filled epoxy resins available from Ajinomoto U.S.A., Inc., Paramus, N.J. U.S.A. The conductive traces 158, 158', may be any conductive material including, but not limited to, copper, aluminum, and alloys thereof.

The formation of the first dielectric layers 156, 156' may be achieved by any known process, including but not limited to lamination, spin coating, roll coating, and spray-on deposition. The conductive traces 158, 158' may extend through their respective dielectric layers 156, 156' to make electrical contact with one another or with the electrical contacts 154. This is accomplished by forming vias through the dielectric layers 156, 156', by any method known in the art, including but not limited to laser drilling and photolithography (usually followed by an etch), or exposure of a photosensitive dielectric material through a mask in a manner analogous to exposure of resist in a photolithographic process, as will be evident to one skilled in the art. The conductive traces 158, 158' may be formed by any known technique, including but not limited to semi-additive plating and photolithographic techniques.

Figure 20:
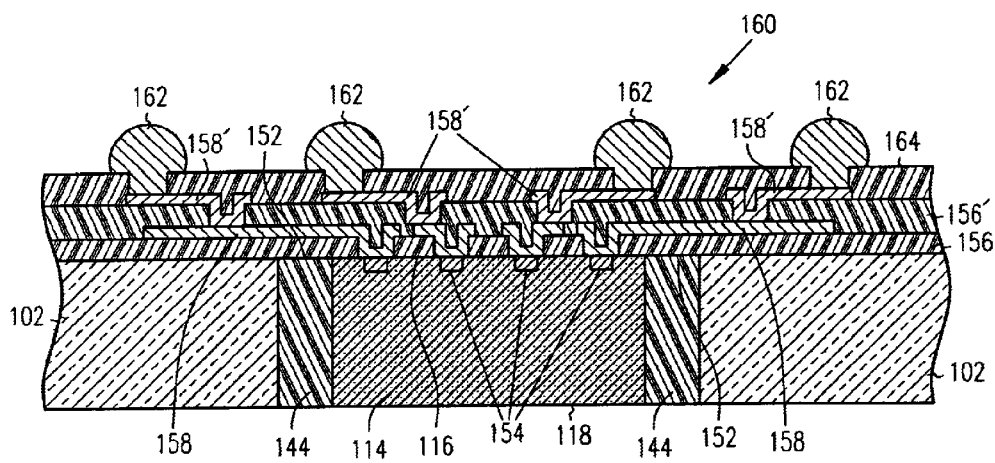
FIG. 20 is a side cross-sectional view of FIG. 16 wherein the interconnection layers having external interconnections attached thereto, according to the present invention.
Figure 21:
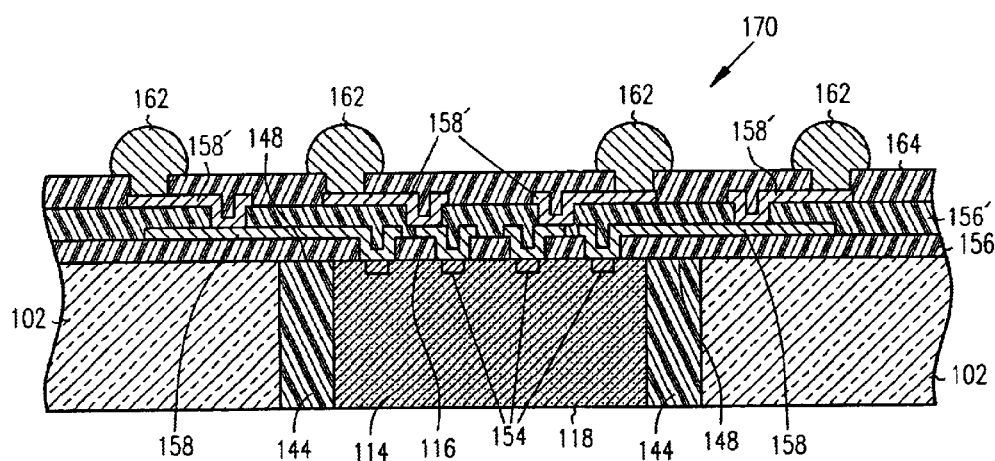
FIG. 21 is a side cross-sectional view of a singulated microelectronic package, according to the present invention.
Figure 22:
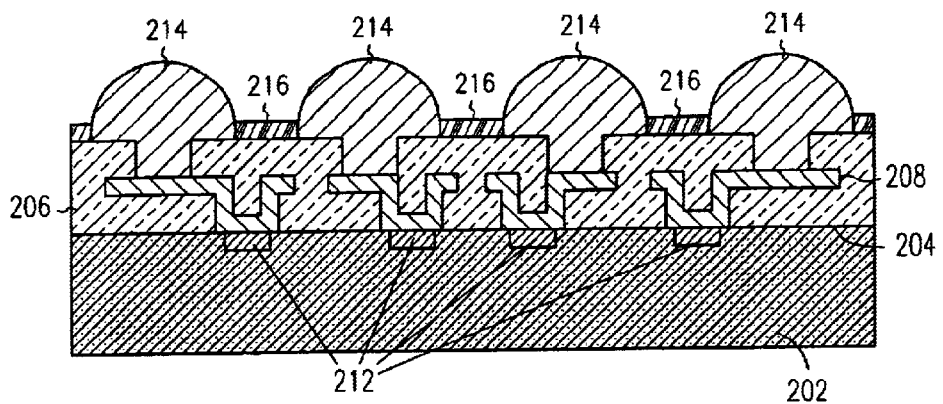
FIG. 22 is a cross-sectional view of a true CSP of a microelectronic device, as known in the art.
Figure 23:
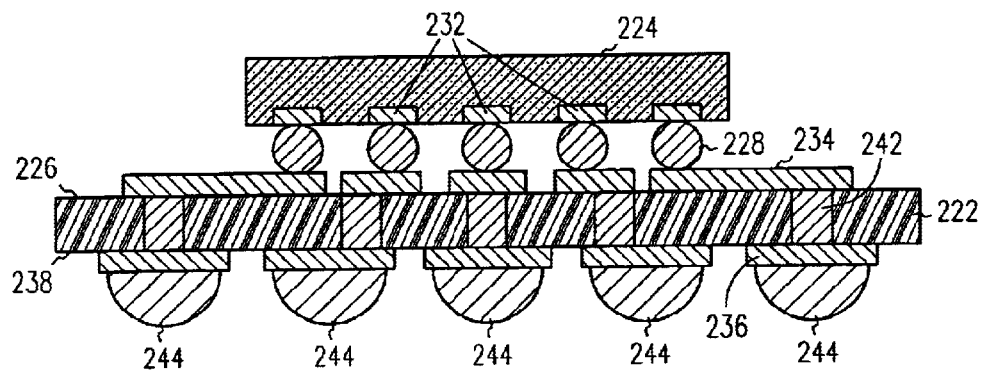
FIG. 23 is a cross-sectional view of a CSP of a microelectronic device utilizing a substrate interposer, as known in the art.
Figure 24:
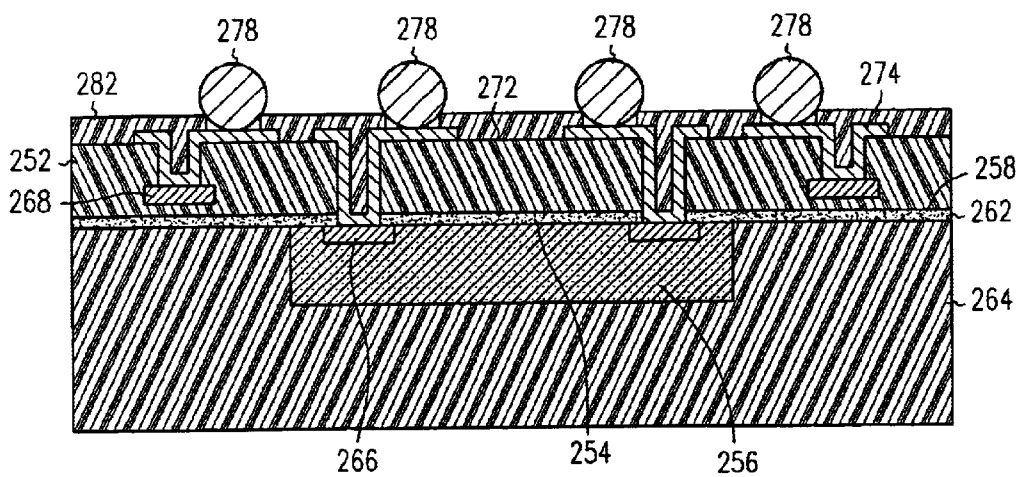
FIG. 24 is a cross-sectional view of a CSP of a microelectronic device utilizing flex component interposer technology, as known in the art.

As shown in FIG. 20, conductive interconnects 162, such as solder bumps, solder balls, pins, and the like, may be formed to contact the conductive traces 158' and used for communication with external components (not shown). FIG. 20 illustrates solder bumps extending through a solder resist dielectric 164 to form assembly 160. After which, individual microelectronic packages 170 may be cut (diced) from the assembly 160 (see FIG. 20), as shown in FIG. 21.

It is, of course, understood that a plurality of microelectronic dice of various sizes could be placed in each microelectronic package core opening 104 and interconnected with the conductive traces 158.

The advantages of the injection process include, but are not limited to, elimination of void formation, which may result from compression molding; no compression forces, which may crack the microelectronic dice 114; dispensing occurs are a low temperature, which may make it simpler to control warpage and die-to-die misalignment; and implementing the process in large assemblies is easier, as the dispensing may be accomplished die-by-die.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabricating a microelectronic package, comprising:

providing a microelectronic package core having a first surface and an opposing second surface, said microelectronic package core having at least one opening defined therein extending from said microelectronic package core first surface to said microelectronic package core second surface;

disposing at least one microelectronic die within said at least one microelectronic package core opening, said at least one microelectronic die having an active surface;

positioning a dispensing tool proximate said microelectronic package core opening not occupied by said at least one microelectronic die; and dispensing an encapsulation material from said dispensing tool.

2. The method of claim 1, wherein positioning said dispensing tool comprises inserting said dispensing tool in said microelectronic package core opening not occupied by said at least one microelectronic die.

3. The method of claim 1, wherein dispensing said encapsulation material from said dispensing tool further includes forming at least one encapsulation material surface substantially planar to said microelectronic die active surface and said microelectronic package core first surface.

4. The method of claim 3, further including forming an interconnection layer on said encapsulation material surface, said microelectronic die active surface and said microelectronic package core first surface.

5. The method of claim 4, wherein forming at least one interconnection layer comprises:

forming at least one dielectric material layer on at least a portion of said microelectronic die active surface, said at least one encapsulation material surface, and said microelectronic package core first surface;

forming at least one via through said at least one dielectric material layer to expose a portion of said microelectronic die active surface; and forming at least one conductive trace on said at least one dielectric material layer which extends into said at least one via to electrically contact said microelectronic die active surface.

6. The method of claim 5, further including forming at least one additional dielectric material layer disposed over said at least one conductive trace and said at least one dielectric material layer.

7. The method of claim 6, further including forming at least one additional conductive trace to extend through and reside on said at least one additional dielectric material layer.

8. The method of claim 1, wherein said providing said microelectronic package core comprises providing a microelectronic package core selected from the group consisting of bismaleimide triazine resin based laminate material, an FR4 laminate material, polyimide laminates, ceramics, and metals.

9. The method of claim 1, wherein dispensing said encapsulation material from said dispensing tool comprises dispensing an encapsulation material selected from the group consisting of plastic, resin, epoxy, and elastomeric materials.

10. The method of claim 1, further including abutting said microelectronic package core first surface and said microelectronic die active surface against a protective film prior to dispensing said encapsulation material from said dispensing tool.

11. The method of claim 10, wherein abutting said microelectronic package core first surface and said microelectronic die active surface against a protective film comprises abutting said microelectronic package core first surface and said microelectronic die active surface against an adhesive layer on said protective film prior to dispensing said encapsulation material from said dispensing tool.

12. The method of claim 1, further including curing said encapsulation material.

13. The method of claim 1, wherein positioning a dispensing tool proximate at least a portion of said microelectronic package core opening not occupied by said at least one microelectronic die comprises positioning a dispensing needle in at least a portion of said microelectronic package core opening not occupied by said at least one microelectronic die.

14. A method of fabricating a microelectronic package, comprising:

providing a protective film;

abutting a first surface of a microelectronic package core against said protective film, said microelectronic package core having at least one opening defined therein extending from said microelectronic package core first surface to a microelectronic package core second surface;

placing at least one microelectronic die within said microelectronic package core opening and abutting an active surface of at least one microelectronic die against said protective film;

positioning a dispensing tool proximate said microelectronic package core opening not occupied by said at least one microelectronic die;

dispensing an encapsulation material from said dispensing tool; and removing said protective film.

15. The method of claim 14, wherein positioning said dispensing tool comprises inserting said dispensing tool in said microelectronic package core opening not occupied by said at least one microelectronic die.

16. The method of claim 14, wherein dispensing said encapsulation material includes forming at least one encapsulation material surface substantially planar to said microelectronic die active surface.

17. The microelectronic package of claim 16, further including forming interconnection layers on at least one of said plurality of microelectronic die active surfaces and said at least one encapsulation material surface.

18. The method of claim 17, wherein forming interconnection layers comprises:

forming at least one dielectric material layer on at least a portion of said microelectronic die active surface and said at least one encapsulation material surface;

forming at least one via through said at least one dielectric material layer to expose a portion of said microelectronic die active surface; and forming at least one conductive trace on said at least one dielectric material layer which extends into said at least one via to electrically contact said microelectronic die active surface.

19. The method of claim 18, further including forming at least one additional dielectric material layer disposed over said at least one conductive trace and said at least one dielectric material layer.

20. The method of claim 19, further including forming at least one additional conductive trace to extend through and reside on said at least one additional dielectric material layer.

21. The method of claim 14, wherein providing said protective film includes providing said protective film having an adhesive thereon; and wherein abutting active surfaces of said at least one microelectronic dice against said protective film comprises abutting said at least one microelectronic die active surface against said adhesive of said protective film.

22. The method of claim 14, wherein said providing said microelectronic package core comprises providing a microelectronic package core selected from the group consisting of bismaleimide triazine resin based laminate material, an FR4 laminate material, polyimide laminates, ceramics, and metals.

23. The method of claim 14, wherein dispensing said encapsulation material from said dispensing tool comprises dispensing an encapsulation material selected from the group consisting of plastic, resin, epoxy, and elastomeric materials.

24. The method of claim 14, further including curing said encapsulation material.

25. A method of fabricating a microelectronic package, comprising:

providing a first protective film;

abutting a first surface of a microelectronic package core against said first protective film, said microelectronic package core having at least one opening defined therein extending from said microelectronic package core first surface to a microelectronic package core second surface;

placing at least one microelectronic die within said microelectronic package core opening and abutting an active surface of at least one microelectronic die against said protective film;

abutting a second protective film against a second surface of said microelectronic package core first surface and a back surface of said microelectronic die to span said at least one opening;

inserting a first dispensing needle through said second protective film into said opening;

inserting a second dispensing needle through said second protective film into said opening;

drawing at least a partial vacuum with said first dispensing needle; and dispensing an encapsulation material from said second dispensing needle.

26. The method of claim 25, wherein dispensing said encapsulation material includes forming at least one encapsulation material surface substantially planar to said microelectronic die active surface.

27. The microelectronic package of claim 25, further including forming interconnection layers on at least one of said plurality of microelectronic die active surfaces and said at least one encapsulation material surface.

28. The method of claim 25, wherein said providing said microelectronic package core comprises providing a microelectronic package core selected from the group consisting of bismaleimide triazine resin based laminate material, an FR4 laminate material, polyimide laminates, ceramics, and metals.

29. The method of claim 25, wherein dispensing said encapsulation material comprises dispensing an encapsulation material selected from the group consisting of plastic, resin, epoxy, and elastomeric materials.

30. The method of claim 25, further including curing said encapsulation material.

* * * * *